United States Patent
Kim et al.

(10) Patent No.: US 9,559,128 B2
(45) Date of Patent: Jan. 31, 2017

(54) PAD STRUCTURE AND DISPLAY DEVICE HAVING THE SAME

(71) Applicant: LG Display Co., Ltd., Seoul (KR)

(72) Inventors: Geunyoung Kim, Gimhae-si (KR); DuHwan Oh, Sejong (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/918,436

(22) Filed: Oct. 20, 2015

(65) Prior Publication Data

US 2016/0190179 A1    Jun. 30, 2016

(30) Foreign Application Priority Data

Dec. 29, 2014    (KR) .................. 10-2014-0192206

(51) Int. Cl.

| | | |
|---|---|---|
| *H01L 29/40* | (2006.01) | |
| *H01L 27/12* | (2006.01) | |
| *H01L 23/00* | (2006.01) | |
| *G02F 1/1345* | (2006.01) | |
| *H01L 27/32* | (2006.01) | |
| *G02F 1/1333* | (2006.01) | |
| *G02F 1/1362* | (2006.01) | |

(52) U.S. Cl.
CPC ......... *H01L 27/1244* (2013.01); *G02F 1/1345* (2013.01); *G02F 1/13458* (2013.01); *H01L 24/05* (2013.01); *H01L 27/3276* (2013.01); *G02F 1/133345* (2013.01); *G02F 2001/13629* (2013.01); *H01L 2224/05009* (2013.01); *H01L 2224/05573* (2013.01)

(58) Field of Classification Search
None
See application file for complete search history.

(56) References Cited

U.S. PATENT DOCUMENTS

| | | |
|---|---|---|
| 2002/0173155 A1 | 11/2002 | Hiromasu et al. |
| 2004/0008167 A1 | 1/2004 | Shigeno |
| 2011/0254005 A1* | 10/2011 | Kim .................. G02F 1/136227 257/59 |

FOREIGN PATENT DOCUMENTS

EP    2772798 A1    9/2014

OTHER PUBLICATIONS

European Extended Search Report, European Application No. 15184287.9, Apr. 15, 2016, 9 pages.

* cited by examiner

*Primary Examiner* — Reema Patel
(74) *Attorney, Agent, or Firm* — Fenwick & West LLP

(57) ABSTRACT

The present disclosure provides a pad structure and associated display device. The pad structure comprises: a plurality of line on glass (LOG) lines that are arranged in parallel in a first direction and in a film bonding area, wherein each of the LOG lines includes a plurality of metal layers of which at least one extends to an outside of the film bonding area, wherein the film bonding area is in a non-active area of a substrate, and wherein the LOG lines are spaced apart from each other, wherein the pad structure further comprises an overcoat layer that is positioned in an external area of the film bonding area, and is adjacent to both boundaries of the film bonding area, wherein the overcoat layer includes a removed portion between each of the LOG lines, wherein the removed portion extends in the first direction.

13 Claims, 10 Drawing Sheets

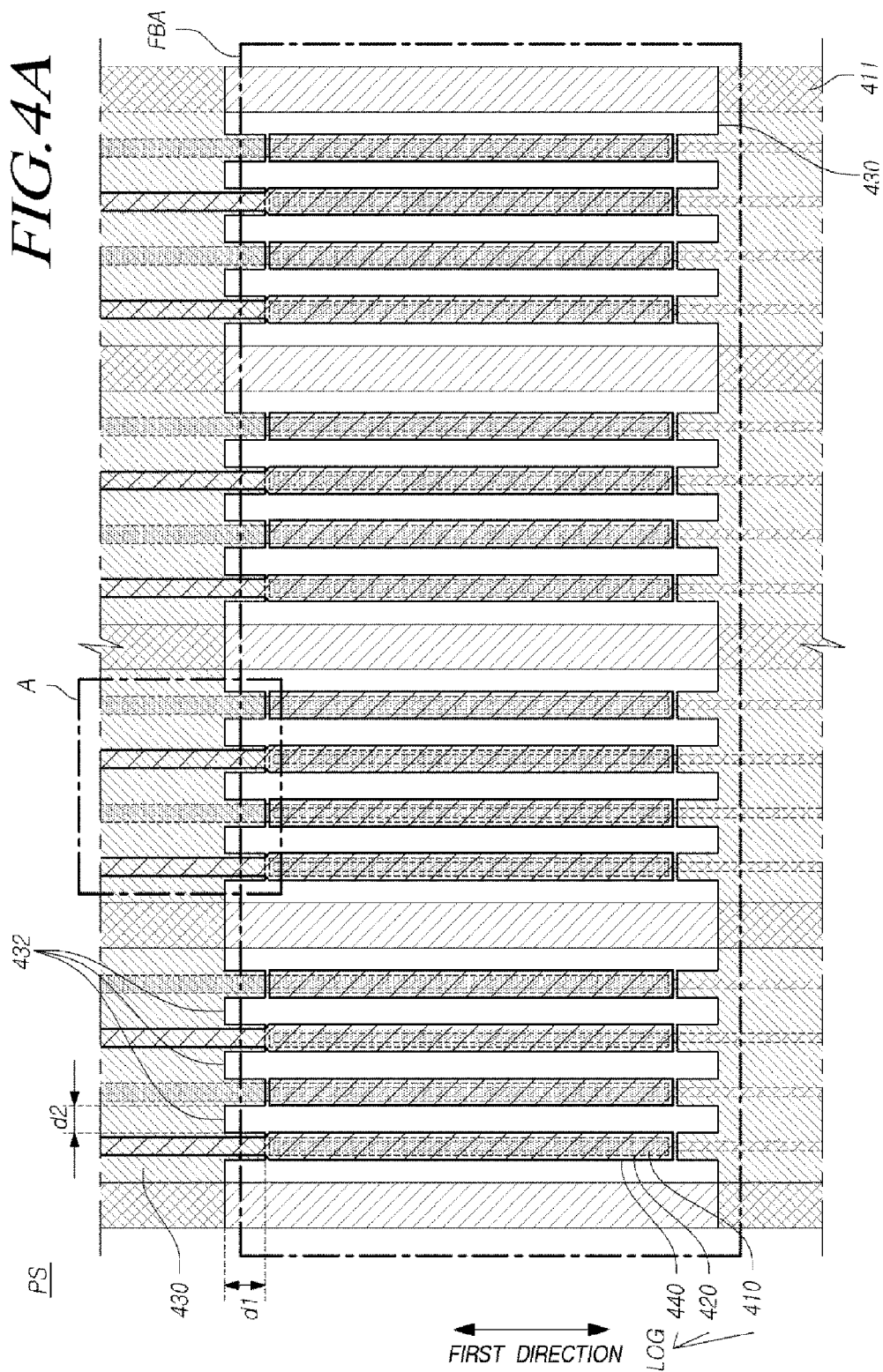

PAD STRUCTURE AND DISPLAY DEVICE HAVING THE SAME

CROSS-REFERENCE TO RELATED APPLICATION

This application claims priority from and the benefit under 35 U.S.C. §119(a) of Korean Patent Application No. 10-2014-0192206, filed on Dec. 29, 2014, which is hereby incorporated by reference for all purposes as is fully set forth herein.

BACKGROUND

1. Field

The present disclosure relates to a pad structure and an associated display device.

2. Description of Related Art

As information technology develops, display devices for displaying an image are increasingly required in various forms. Therefore, research continues into developing thinner, lighter, and more power-efficient display devices.

As a representative example, flat display devices include Liquid Crystal Display (LCD) devices, Plasma Display Panel (PDP) devices, Field Emission Display (FED) devices, Electro Luminescence Display (ELD) devices, Electro-Wetting Display (EWD) devices, and Organic Light Emitting Display (OLED) devices.

Generally, a flat display device includes a display panel, a gate driving unit, a data driving unit, a timing controlling unit and a voltage generating unit. The display panel defines a pixel by intersections of a plurality of gate lines and a plurality of data lines. The gate driving unit drives the plurality of gate lines. The data driving unit includes a plurality of data-driving integrated circuits which drive the plurality of data lines. The timing controlling unit provides various control signals to the gate driving unit and the data driving unit. The voltage-generating unit generates a reference voltage and provides the reference voltage to the data driving unit.

A plurality of gate driving integrated circuits or a plurality of data driving integrated circuits may be mounted on a film in a Chip On Film (COF) type.

Meanwhile, in a display device, a pad structure connects a film on which a data driving integrated circuit or a gate integrated circuit is mounted with various signal lines. In the pad structure, exposed lines are corroded around an area where the film is bonded. In addition, a short-circuit occurs between adjacent lines or metal layers. In addition, a line open or line disconnection occurs in a line due to a step difference of an insulating film included in the pad structure.

SUMMARY

There is provided a pad structure for preventing corrosion of a LOG line, preventing a line opening in an insulating film step difference area, and preventing a short-circuit between different metal layers. Also disclosed is a display device having the pad structure. Aspects of the invention are defined in the appended independent claims.

A pad structure is provided comprising: a plurality of Line On Glass (LOG) lines that are arranged in parallel in a first direction within a film bonding area, and include a plurality of metal layers of which at least one extends to an outside of the film bonding area. The film bonding area is in a non-active area of a substrate, with the plurality of LOG lines spaced apart from each other; further, an overcoat layer is positioned in an external area of the film bonding area and is adjacent to both boundaries of the film bonding area. The overcoat layer further includes a concave portion between each of the plurality of LOG lines, the concave portion being dug concavely in the first direction.

Additionally, a display device is provided comprising: a plurality of signal lines that are arranged in an active area of a substrate; and a pad structure that is positioned in a non-active area of the substrate.

Here, the pad structure may comprise: a plurality of Line On Glass (LOG) lines that are arranged in parallel, in a first direction within a film bonding area, and including a plurality of metal layers of which at least one extends to an outside of the film bonding area. The film bonding area is in the non-active area of the substrate, the plurality of LOG lines being spaced apart from each other. An overcoat layer is positioned in an external area of the film bonding area and is adjacent to both boundaries of the film bonding area. The overcoat layer further includes a concave portion between each of the plurality of LOG lines, the concave portion being dug concavely in the first direction.

The pad structure and the display device having the pad structure can prevent corrosion of a LOG line, prevent a line opening in an insulating film step difference area, and prevent a short-circuit between different metal layers.

The features and advantages described in this summary and the following detailed description are not intended to be limiting. Many additional features and advantages will be apparent to one of ordinary skill in the art in view of the drawings, specification and claims.

BRIEF DESCRIPTION OF THE DRAWINGS

The above and other objects, features and advantages will be more apparent from the following detailed description taken in conjunction with the accompanying drawings, in which:

FIG. 4A is a plan view illustrating a pad structure of a display device, according to one embodiment.

DETAILED DESCRIPTION

Figure 1:
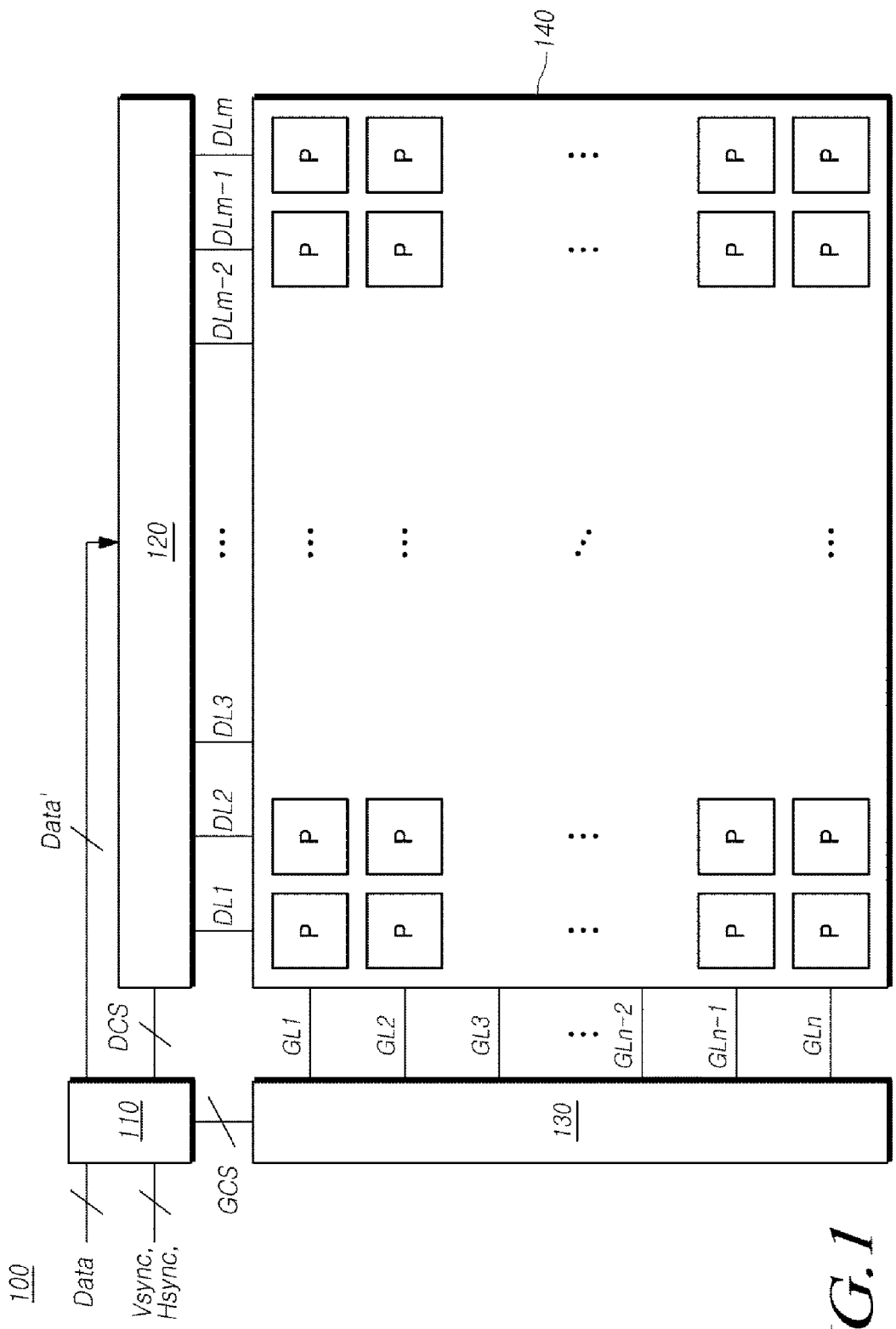
FIG. 1 is a schematic system configuration diagram illustrating a display device, according to one embodiment.

Hereinafter, embodiments will be described with reference to the accompanying drawings. In the following description, like components will be designated by like reference numerals although they are shown in different drawings. Further, in the following description, a detailed description of known functions and configurations incorporated herein will be omitted when it may make the subject matter of the present disclosure rather unclear.

In addition, terms, such as first, second, A, B, (a), (b) or the like may be used herein when describing components. These terms are merely used to distinguish one structural element from other structural elements, and a property, order, sequence or the like of a corresponding structural element is not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described that a certain element is formed "on" or "under" another element, it should be understood that the certain element may be formed either directly or indirectly via a still another element on or under another element.

FIG. 1 is a schematic system configuration diagram concerning a display device to which embodiments are applied.

Referring to FIG. 1, a display device 100 includes a display panel 140 in which m (m is a natural number) data lines DL1, . . . , DLm and n (n is a natural number) gate lines GL1, . . . , GLn are formed, a data driving unit driving m data lines DL1, . . . , DLm, a gate driving unit sequentially driving n gate lines GL1, . . . , GLn, a timing controlling unit 110 controlling the data driving unit 120 and the gate driving unit 130, and the like.

First, the timing controlling unit 110 outputs a Data Control Signal (DCS) for controlling the data driving unit 120 and a Gate Control Signal (GCS) for controlling the gate driving unit 130, based on an external timing signal such as vertical/horizontal synchronization signals Vsync and Hsync, image data Data and a clock signal CLK which are input from a host system. Also, the timing controlling unit 110 may convert image data Data input from the host system into a data signal format that is used in the data driving unit 120, and may provide the converted image data Data' to the data driving unit 120.

The data driving unit 120 converts the image data Data' to a data signal (analog pixel signal or data voltage), which is a voltage value corresponding to a gray scale value, and provides the same to data lines DL1 to DLm, in response to the DCS and the converted image data Data' input from the timing controlling unit 110.

That is, the data driving unit 120 stores the input image data Data in a memory (not shown) under a control of the timing controlling unit 110, when a specific gate line is activated, the data driving unit 120 converts corresponding image data Data into a data voltage (Vdata) of an analog format, and provides the data voltage to m data lines DL1, . . . , and DLm to drive m data lines DL1, . . . , and DLm.

In addition, the data driving unit 120 may include a plurality of data driving integrated circuits (i.e., data driver ICs or a source driver ICs). The plurality of data driving integrated circuits may be connected to a bonding pad of the display panel 140 through a Tape Automated Bonding (TAB) method or a Chip On Glass (COG) method. Alternatively, a driving chip package (not shown) of a Chip On Film (COF) type may be connected through a Film On Glass (FOG) method, or the plurality of driving integrated circuits may be directly formed in the display panel 140. In some embodiments, the plurality of data driving integrated circuits may be integrated and formed in the display panel 140.

Meanwhile, the gate driving unit 130 sequentially supplies a scan signal (a gate pulse or a scan pulse, and a gate-on signal) to the gate lines GL1, . . . , GLn in response to the GCS input from the timing controlling unit 110.

The gate driving unit 130 may be positioned on only one side of the display panel 140 as illustrated in FIG. 1 or may be divided into two units and positioned on both sides of the display panel 140, depending on a driving type of the gate driving unit 130.

In addition, the gate driving unit 130 may include a plurality of gate drive integrated circuits. The plurality of gate driving integrated circuits may be connected to a bonding pad of the display panel 140 through a Tape Automated Bonding (TAB) method or a Chip On Glass (COG) method, or implemented in a Gate In Panel (GIP) type and directly formed in the display panel 140. Occasionally, the plurality of gate driving integrated circuits may be integrated and formed in the display panel 140.

In the present specification, the gate driving unit 130 is illustrated as the GIP type, and is positioned on only one side of the display panel 140, but the display device 100 according to the present disclosure is not limited thereto.

In the display panel of the display device 100, a plurality of signal lines DLm and GLn are arranged in an active area of a substrate (not shown), and a pad structure (not shown) is formed in a non-active area of the substrate (not shown). Here, the pad structure (not shown) includes a plurality of Line On Glass (LOG) lines (not shown) and an overcoat layer (not shown). The plurality of LOG lines (not shown) are arranged in parallel, in a first direction within a film bonding area (not shown), and include a plurality of metal layers (not shown) of which at least one extends to an outside of the film bonding area (not shown). Here, the film bonding area (not shown) is in the non-active area of the substrate (not shown), and the plurality of LOG lines (not shown) is spaced apart from each other. The overcoat layer (not shown) is positioned in an external area of the film bonding area (not shown), adjacent to both boundaries of the film bonding area (not shown), and includes a concave portion (not shown) between each of the plurality of LOG lines (not shown). Here, the concave portion (not shown) is dug concavely in the first direction.

The overcoat layer (not shown) overlaps the metal layer which extends to the outside of the film bonding area, which is in the LOG line (not shown). Meanwhile, the concave portion (not shown) of the overcoat layer (not shown) does not overlap the metal layer (not shown) of the LOG line, which extends to the outside of the film bonding area. In addition, the dug length of the concave portion (not shown) in the first direction is longer than the width between adjacent LOG lines (not shown).

The pad structure (not shown) and associated display device 100, according to embodiments, can prevent corrosion of an LOG line (not shown), prevent an opening or disconnection of a line in a step difference area of an insulating film, and prevent a short-circuit between different metal layers (not shown).

Meanwhile, each pixel P of the display panel 140 may be formed in an area defined by the data lines DL1 to DLm and the gate lines GL1 to GLn, and thus may be disposed in a matrix form. For example, when the display panel 140 is an organic light-emitting display panel, a circuit element such as an organic light-emitting diode, which includes a pixel electrode of a first electrode, a common electrode (i.e., a cathode) of a second electrode, an organic layer, two or more thin film transistors, and one or more capacitors, may be formed in the pixel.

Figure 2:
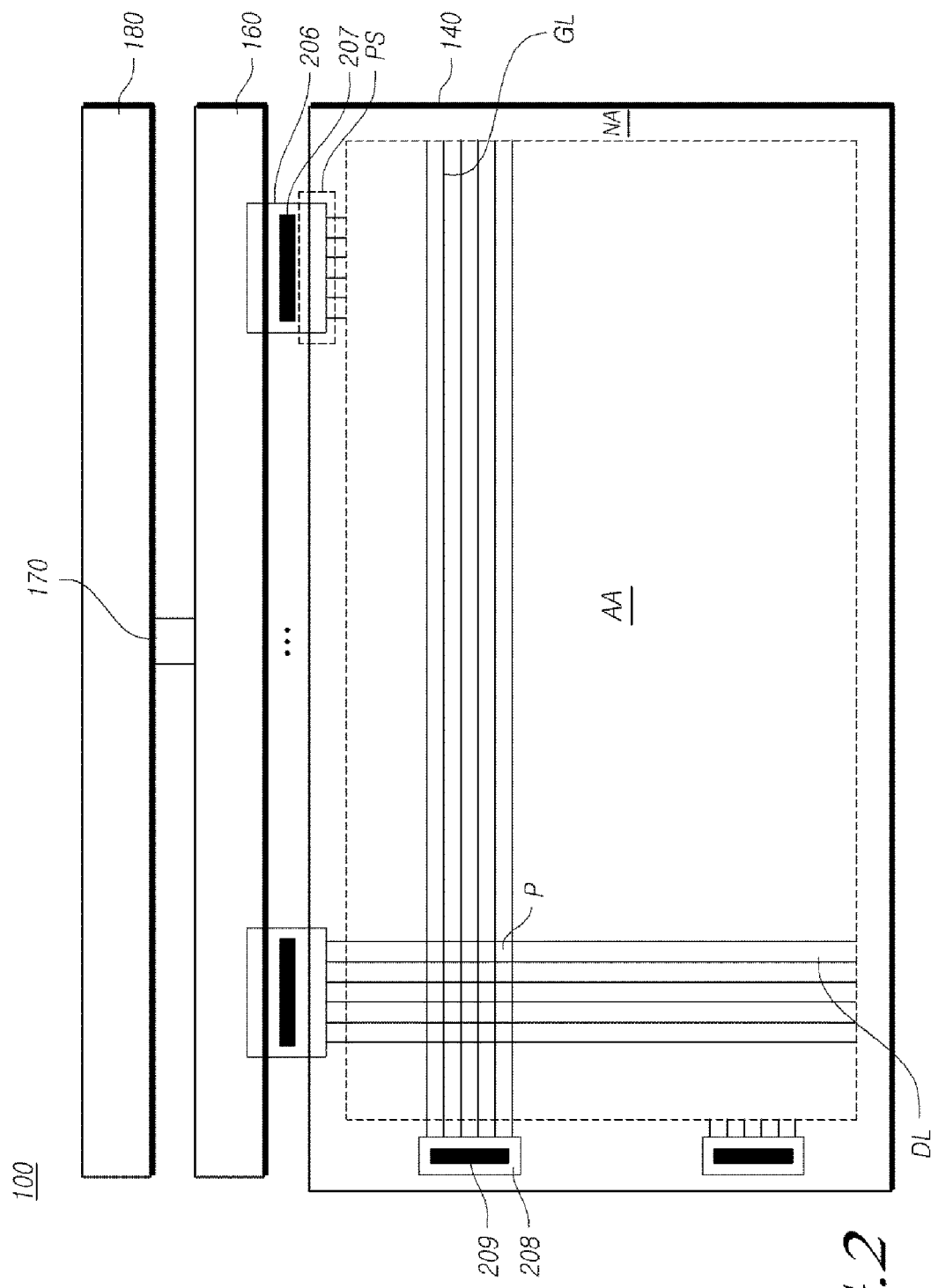
FIG. 2 is a schematic plan view of a display device, according to one embodiment.

FIG. 2 is a schematic plan view of a display device to which embodiments are applied.

FIG. 2 is an example view describing the display device 100 and a pad structure in the display device 100, according to one embodiment.

Referring to FIG. 2, the display device 100 may include a plurality of signal lines GL and DL arranged in an Active Area (AA) AA of a substrate (not shown), and a pad structure PS positioned in a Non-active Area (NA) NA of the substrate (not shown) and connected to the signal lines GL and DL.

Here, although not shown, various signal lines besides the gate line GL and the data line DL may be disposed on the substrate (not shown). In addition, a position, a shape and the number of the pad structure (PS) PS is not limited to the drawing, and the PS may be formed in various ways.

Here, the pad structure PS may include a plurality of Line On Glass (LOG) lines (not shown) and an overcoat layer (not shown). The plurality of LOG lines (not shown) are arranged in parallel, in a first direction within a film bonding area (not shown), and include a plurality of metal layers (not shown) of which at least one extends to an outside of the film bonding area (not shown). Here, the film bonding area (not shown) is in the non-active area NA of the substrate, and the plurality of LOG lines (not shown) is spaced apart from each other. The overcoat layer (not shown) is positioned in an external area of the film bonding area (not shown), adjacent to both boundaries of the film bonding area (not shown), and includes a concave portion (not shown) between each of the plurality of LOG lines (not shown). Here, the concave portion (not shown) is dug concavely in the first direction.

In the present specification, the first direction may refer to up and down directions or left and right directions in the drawing. For example, in the case of the pad structure PS positioned in an area where a data driving film 206 (on which a data driving integrated circuit is mounted) is bonded, the first direction may refer to the up and down direction.

The pad structure PS may be a data pad structure PS connected to the data line DL among the plurality of signal lines GL and DL, or it may be a gate pad structure PS connected to the gate line GL among the plurality of signal lines GL and DL. In FIG. 2, the pad structure PS is illustrated based on the data pad structure PS, but the pad structure is not limited thereto, and the pad structure PS may be applied to the gate pad structure PS.

Specifically, the display panel 140 of the display device 100 may include the active area AA and the non-active area NA. The non-active area NA is formed around the active area AA. The non-active area NA is formed at an edge of the display panel 140. In the active area AA, the plurality of gate lines GL1 to GLn and data lines DL1 to DLm intersect, and pixels P are defined at each intersected point. Although not shown, in the active area AA, a plurality of other lines besides the gate lines GL1 to GLn and the data lines DL1 to DLm may be formed in the active area AA.

In one side (i.e., a left side of the drawing) of the non-active area NA, a gate driving film 208 on which a gate driving integrated circuit 209 is mounted is formed through a Gate In Panel (GIP) method.

The gate driving film 208 is joined to the substrate (not shown) of the display panel 140 to be connected to the gate lines GL1 to GLn and lines formed in the non-active area NA in a Line On Glass (LOG) method. In FIG. 2, two gate-driving integrated circuits 209 are shown, but the larger the display panel 140 is, the more numerous the gate driving integrated circuits 209. In addition, when the size of the display panel 140 becomes larger, the gate driving integrated circuits 209 may be joined to left and right sides of the display panel 140. The gate driving integrated circuit 209 sequentially provides a gate pulse to the gate lines GL.

Meanwhile, a plurality of the data driving films 206 is disposed to the upper side (i.e., an upper side of the drawing) of the non-active area NA, and one end of the data driving film 206 is connected to a Source Printed Circuit Board (SPCB) 160.

The data driving integrated circuit 207 may be a source drive IC (i.e., a source driving integrated circuit) and may be embedded in the data driving film 206. Here, the data driving film 206 may be a source flexible circuit film. Input terminals of the data driving film 206 may be connected to the substrate (not shown) of the display panel 140 and the SPCB 160 through an Anisotropic Conductive Film (ACF) including a conductive ball. The image data Data and a timing control signal may be transmitted to the data driving integrated circuit 207 through lines of a Line On Film (LOF) method, which are formed on the SPCB 160 and the data driving film 206.

The data driving integrated circuit 207 may receive the image data Data from the timing controller 110, convert the image data Data using an Analog to Digital Converter (ADC) to generate a data voltage, and provide the data voltage to the data lines DL.

Meanwhile, the SPCB 160 is connected to a Control Printed Circuit Board CPCB 180 through a flexible circuit cable 170. The CPCB 180 may include the timing controller 110 and a power driving integrated circuit (not shown).

Lines for transmitting power and signals necessary in driving the data driving integrated circuit 207 and the gate driving integrated circuit 209 are formed on the SPCB 160. The SPCB 160 may be divided into a plurality of the SPCBs 160 according to the size of the display panel 140 and may be connected to the display panel 140.

The timing controller 110 and a circuit such as the power driving integrated circuit (not shown) are mounted on the CPCB 180.

As described above, the timing controller 110 outputs a Data Control Signal (DCS) for controlling the data driving unit 120 to the data driving integrated circuit 207 and outputs a Gate Control Signal (GCS) for controlling the gate driving unit 130 to the gate driving integrated circuit 209, based on an external timing signal such as vertical/horizontal synchronization signals Vsync and Hsync, image data Data and a clock signal CLK which are input from a host system. Also, the timing controller 110 may convert image data Data input from the host system into a data signal format that is used in the data driving unit 120, and may provide the converted image data Data' to the data driving unit 120.

Here, the host system may be any of a TV system, a set-top box, a navigation system, a DVD player, a Blu-ray player, a PC, a home theater system, and a phone system.

Meanwhile, a power driving chip (not shown) generates power applied to the pixel P, power of the data driving integrated circuit 207 and the gate driving integrated circuit 209, a gamma compensating voltage (VGMA), gate driving power (VGH and VGL), and the like.

Hereinafter, the pad structure PS refers to the data pad structure PS, the gate pad structure PS, or a structure of an area positioned to one side of the non-active area NA in the display panel 140, as illustrated in FIG. 2.

Figure 3A:
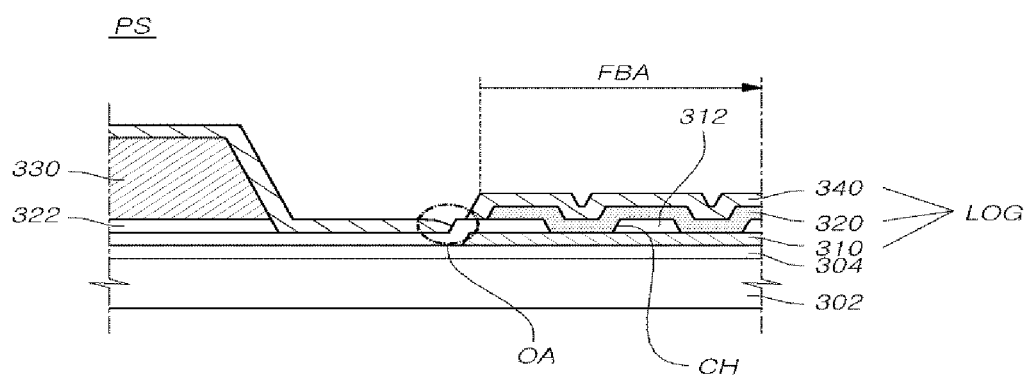
FIGS. 3A and 3B are schematic cross-sectional views illustrating examples of a pad structure in a normal display device, according to one embodiment.
Figure 3B:
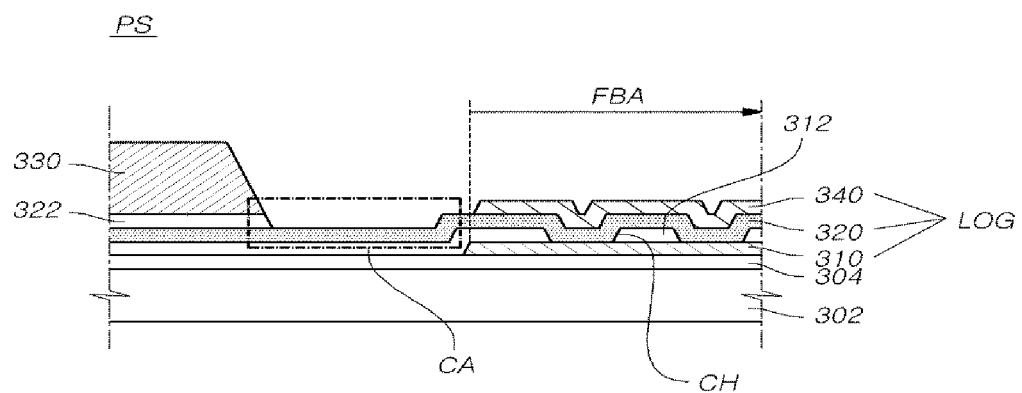

FIGS. 3A and 3B are schematic cross-sectional views illustrating examples of a pad structure in a normal display device, according to one embodiment.

Referring to FIG. 3A, the pad structure PS of the display device 100 includes a first insulating film 304 on a substrate 302, a first metal layer 310 on the first insulating film 304, a second insulating film 312 covering the first metal layer 310 and having at least one contact hole CH, and a second metal layer 320 disposed on the second insulating film 312 and connected to the first metal layer 310 through the contact hole CH. Here, the first metal layer 310 and the second metal layer 320 are formed in a Film Bonding Area (FBA) where the data driving film 206 or the gate driving film 208 is bonded.

In addition, the pad structure PS includes a third insulating film 322 on the second insulating film 312 and an overcoat layer 330 on the third insulating film 322, in an external area of the film bonding area FBA. In addition, the pad structure PS includes a third metal layer 340 covering the overcoat layer 330, an exposed second insulating film 312 and the second metal layer 320.

The first metal layer 310, the second metal layer 320 and the third metal layer 340 forms an LOG line.

In the case of the normal pad structure PS, an open phenomenon may occur in which the third metal layer 340 is disconnected due to a step difference in the insulating films 312 and 322. That is, an open area (OA) OA may be formed in a step difference portion which may be in the insulating films 312 and 322. When the open area OA occurs, a problem may occur in transmitting signals from the driving films 206 and 208 to the signal lines GL and DL of the active area. In addition, an inspection cannot be smoothly performed when the display panel 140 is inspected.

Meanwhile, referring to FIG. 3B, the pad structure PS of the display device 100 includes a first insulating film 304 on a substrate 302, a first metal layer 310 on the first insulating film 304, a second insulating film 312 covering the first metal layer 310 and having at least one contact hole CH, and a second metal layer 320 disposed on the second insulating film 312 and connected to the first metal layer 310 through the contact hole CH.

In addition, the pad structure PS includes a third insulating film 322 on the second insulating film 312 and an overcoat layer 330 on the third insulating film 322, in an external area of the film bonding area FBA. In addition, the pad structure PS includes a third metal layer 340 deposed on the FBA and making contact with the second metal layer 320.

Here, the first metal layer 310 and the second metal layer 320 are formed in the film bonding area FBA on which the data driving film 206 or the gate driving film 208 is bonded. In contrast, the second metal layer 320 is disposed in the film bonding area FBA, and is further extended to the outside of the film bonding area FBA. In addition, the first metal layer 310, the second metal layer 320 and the third metal layer 340 form an LOG line.

In the case of the normal pad structure PS, as shown in the drawing, a Corrosion Area (CA) CA may occur where the second metal layer 320 is exposed to the outside and is corroded. When such an open area is generated, signals may not be transferred from the driving films 206 and 208 to the signal lines GL and DL of the active area, and an inspection of the display panel 140 cannot be performed smoothly.

According to the embodiments described herein, a pad structure and associated display device 100 have a structure capable of resolving the previously described problems.

FIG. 4A is a plan view illustrating a pad structure of a display device, according to one embodiment.

Referring to FIG. 4A, the pad structure PS may include a plurality of line on glass (LOG) lines LOG and an overcoat layer 430. The plurality of LOG lines LOG are arranged in parallel in a first direction (i.e., up and down directions in the drawing), within a film bonding area FBA of a substrate 402, and include a plurality of metal layers 410, 420 and 440 of which at least one extends to an outside of the film bonding area FBA. Here, the film bonding area FBA is in the non-active area NA of the substrate 402, and the plurality of LOG lines LOG are spaced apart from each other. The overcoat layer 430 is positioned in an external area of the film bonding area FBA, adjacent to both boundaries of the film bonding area FBA, and includes a concave portion 432 between each of the plurality of LOG lines LOG. Here, the concave portion 432 is dug concavely in the first direction.

Here, the overcoat layer 430 may overlap the metal layers 410, 420 and 440 which extend to the outside of the film bonding area FBA. In contrast, the concave portion 432 of the overcoat layer 430 does not overlap the metal layers 410, 420 and 440 which extend to the outside of the film bonding area FBA.

Specifically, the pad structure PS may be a data pad structure PS on which the data driving film 206 is bonded or mounted, or may be a gate pad structure PS on which the gate driving film 208 is bonded or mounted.

The pad structure PS includes the film bonding area FBA where the films 206 and 208 are bonded. The film bonding area FBA is an area where the overcoat layer 430 is not formed. That is, the film bonding area FBA is bonded to lines of a line on film (LOF) method, which are disposed on the data driving film 206 or the gate driving film 208, through an Anisotropic Conductive Film (ACF) including a conductive ball.

Meanwhile, in the pad structure PS of the display panel 140, a plurality of lines is disposed on a substrate (not shown), and the plurality of LOG lines LOG and a high voltage power line 411 may be included in the plurality of lines. However, this is illustrated as an example, and embodiments are not limited thereto.

The plurality of LOG lines LOG may be arranged between each of the high voltage power lines 411 arranged in the first direction. However, embodiments are not limited thereto, and may be designed in various numbers and forms.

The LOG line LOG may include the first metal layer 410, the second metal layer 420 and the third metal layer 440. The first metal layer 410 may be connected to the second metal layer 420 through at least one contact hole (not shown) in an insulating film (not shown) between the first metal layer 410 and the second metal layer 420. The second metal layer 420 may make contact with the third metal layer 440. That is, the first metal layer 410 makes contact with the second metal layer 420 through at least one contact hole (not shown), and the second metal layer 420 makes contact with the third metal layer 440 in a whole area of the film bonding area FBA.

In addition, in the plurality of LOG lines LOG, the second metal layer 420 and the third metal layer 440 alternately extend to the outside of the film bonding area FBA. Specifically, in FIG. 4, the second metal layer 420 and the third metal layer 440 alternately extend to the upper side (i.e., the upper side of the drawing) of the film bonding area FBA, which is the end of the display panel 140.

The extended portion has a line type for various inspections of the display panel 140 and the display device 100. In order to prevent a short between adjacent LOG lines LOG, the second metal layer 420 and the third metal layer 440, which are positioned on different layers, are alternately positioned.

Meanwhile, the first metal layer 410 extending to the lower side (i.e., the lower side in the drawing) of the film bonding area FBA may be a link line which is connected to the signal lines GL and DL formed in the active area AA, but is not limited thereto.

For example, in the LOG lines LOG, the first metal layer 410 may be positioned on the same layer as the gate line GL of the active area AA, and may be simultaneously formed of the same material as the gate line GL. For example, the first metal layer 410 may be formed of copper (Cu), molybdenum (Mo), or the like, but is not limited thereto.

The second metal layer 420 may be positioned on the same layer as the data line DL of the active area AA, and may be simultaneously formed of the same material as the data line DL. For example, the second metal layer 420 may be formed of copper (Cu), molybdenum (Mo), or the like, but is not limited thereto.

In addition, the third metal layer 440 may be positioned on the same layer as a pixel electrode (a first electrode or an anode electrode) which is positioned in the active area AA, and may be simultaneously formed of the same material as the pixel electrode (not shown). For example, the third metal layer 440 may be formed of a transparent metal such as Indium Tin Oxide (ITO), but is not limited thereto.

In FIG. 4, four LOG lines LOG are arranged between the high voltage power lines 411, but embodiments are not limited thereto, and more LOG lines LOG may be arranged between the high voltage power lines 411.

Meanwhile, the overcoat layer 430 is positioned to the outside of the film bonding area FBA, and is adjacent to both boundaries of the film bonding area FBA. That is, in the overcoat layer 430, a portion except for the concave portion 432 makes contact with an upper boundary of the film bonding area FBA and a lower boundary of the film bonding area FBA.

The overcoat layer 430 includes the concave portion 432 which is concavely dug in the first direction, between each of the plurality of LOG lines LOG. Here, the first direction means up and down directions in the drawing, and the concave portion 432 is concavely dug in a direction far from the film bonding area FBA. A shape of the concave portion 432 may be variously designed besides a rectangle shown in the drawing.

The overcoat layer 430 prevents an exposure of the LOG line LOG compared to the normal pad structure shown in FIG. 3B, and thus can prevent a corrosion of the LOG line. In addition, the overcoat layer 430 can prevent an open of the LOG line LOG due to the step difference of the insulating films 312 and 322, compared to the normal pad structure shown in FIG. 3A.

Meanwhile, when the concave portion 432 is not included in the overcoat layer 430 and all boundaries of the overcoat layer 430 make contact with the film bonding area FBA, a remaining film of material in the metal layers 410, 420 and 440 of neighboring LOG line LOG, for example, ITO which is the same as material of the pixel electrode (not shown) is formed in the insulating films 312 and 322, and thus a short between different LOG lines LOG may occur. The concave portion 432 of the overcoat layer 430 prevents such a short.

Meanwhile, the length d1 dug in the first direction of the concave portion 432 in the overcoat layer 430 may be longer than the width d2 between adjacent LOG lines LOG. Thus, the short between the adjacent LOG lines LOG can be prevented.

Figure 4B:
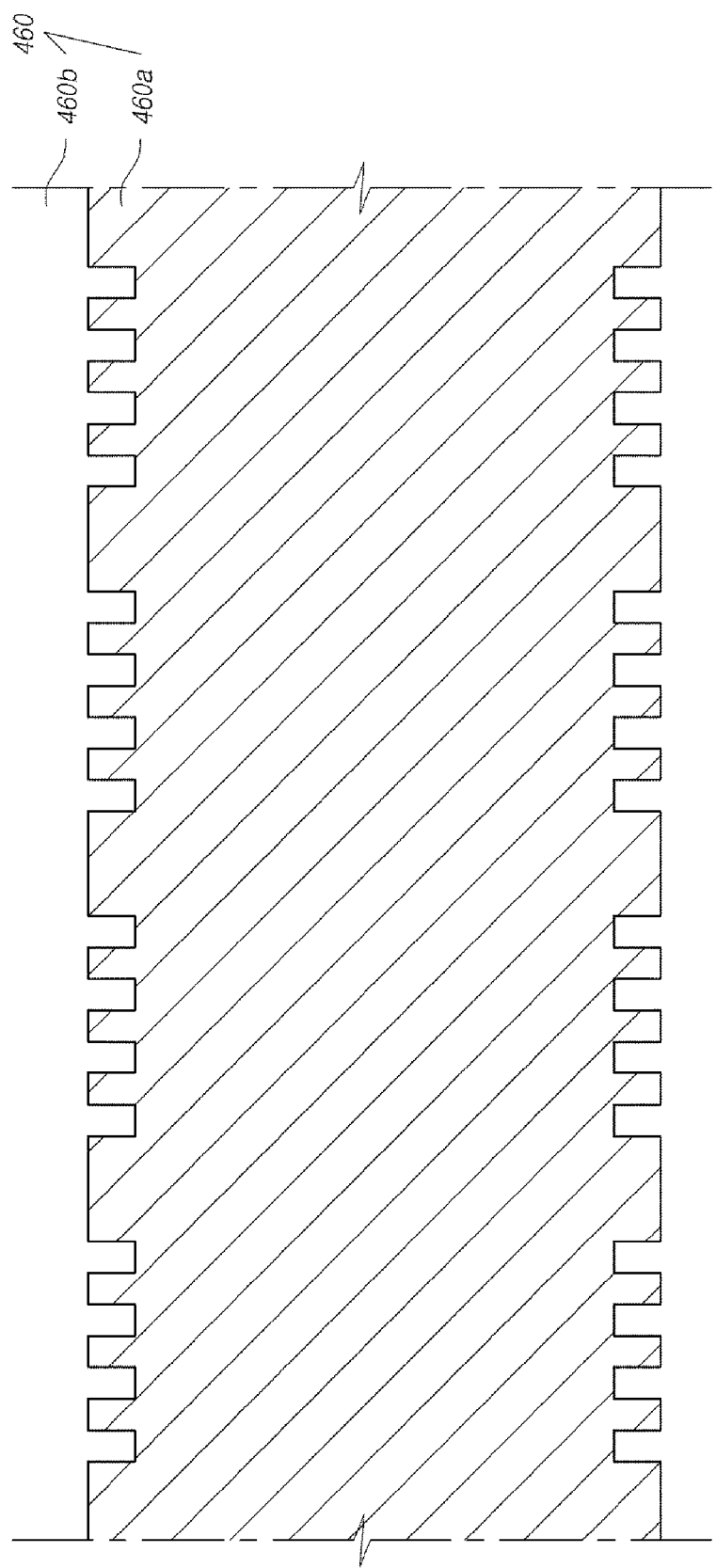
FIG. 4B is a plan view illustrating a mask for forming an overcoat layer of the pad structure in FIG. 4A, according to one embodiment.

FIG. 4B is a plan view illustrating a mask for forming the overcoat layer of the pad structure in FIG. 4A, according to one embodiment.

Referring to FIG. 4B, although a method of manufacturing the pad structure PS is not shown, the overcoat layer 430 including the concave portion 432 is formed through an exposure process and a development process using a mask 460 which includes a light blocking portion 460a and a light transmitting portion 460b, after material for forming the overcoat layer 430 is deposited on a whole surface of the pad structure PS.

The method using the mask 460 shown in FIG. 4B is a forming method of a negative type. The material for forming the overcoat layer 430 may include a light hardening material. The exposed portion of the material for forming the overcoat layer 430 may be hardened by the light transmitting portion 460b. The portion corresponding to the light blocking portion 460a may be removed by a developer, and thus the overcoat layer 430 may be formed. However, in an alternate embodiment, the overcoat layer 430 may be formed through a positive type process.

Figure 5:
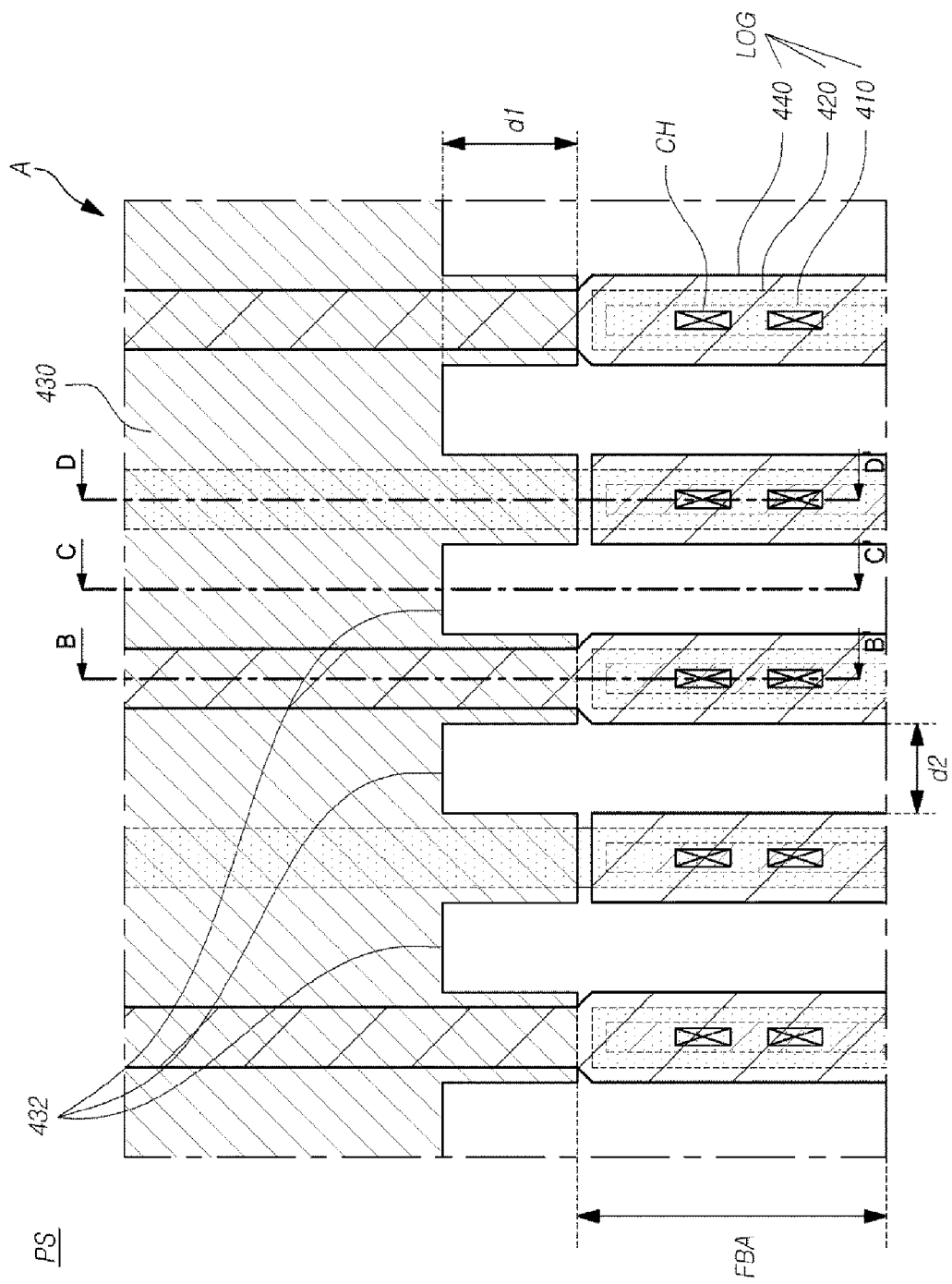
FIG. 5 is a plan view illustrating another example of a portion 'A' in FIG. 4A, according to one embodiment.

FIG. 5 is a plan view illustrating another example of a portion 'A' in FIG. 4A, and is a view for illustrating the pad structure in more detail.

Referring to FIG. 5, the pad structure PS may include a plurality of Line On Glass (LOG) lines LOG and an overcoat layer 430. The plurality of LOG lines LOG are arranged in parallel, in a first direction (i.e., up and down directions in the drawing), and in a film bonding area FBA of a substrate 402, and include a plurality of metal layers 410, 420 and 440 of which at least one extends to an outside of the film bonding area FBA. Here, the film bonding area FBA is in the non-active area NA of the substrate 402, and the plurality of LOG lines LOG are spaced apart from each other. The overcoat layer 430 is positioned in an external area of the film bonding area FBA, is adjacent to both boundaries of the film bonding area FBA, and includes a concave portion 432 between each of the plurality of LOG lines LOG. Here, the concave portion 432 is dug concavely in the first direction.

Here, the overcoat layer 430 may overlap the metal layers 410, 420 and 440 which extend to the outside of the film bonding area FBA. In contrast, the concave portion 432 of the overcoat layer 430 does not overlap the metal layers 410, 420 and 440 which extend to the outside of the film bonding area FBA.

Specifically, the pad structure PS may be a data pad structure PS on which the data driving film 206 is bonded or mounted, or may be a gate pad structure PS on which the gate driving film 208 is bonded or mounted.

The LOG line LOG may include the first metal layer 410, the second metal layer 420 and the third metal layer 440. The first metal layer 410 may be connected to the second metal layer 420 through at least one contact hole CH in an insulating film (not shown) between the first metal layer 410 and the second metal layer 420. The second metal layer 420 may make contact with the third metal layer 440. That is, the first metal layer 410 makes contact with the second metal layer 420 through at least one contact hole CH, and the second metal layer 420 makes contact with the third metal layer 440 in a whole area of the film bonding area FBA.

In addition, in the plurality of LOG lines LOG, the second metal layer 420 and the third metal layer 440 alternately extend to the outside of the film bonding area FBA. Specifically, in FIG. 5, the second metal layer 420 and the third metal layer 440 alternately extend to the upper side (i.e., the upper side of the drawing) of the film bonding area FBA, which is the end of the display panel 140.

The extended portion has a line type for various inspections of the display panel 140 and the display device 100. In order to prevent a short between adjacent LOG lines LOG, the second metal layer 420 and the third metal layer 440 which are positioned on different layers are alternately positioned.

Meanwhile, the overcoat layer 430 is positioned to the outside of the film bonding area FBA, and is adjacent to both boundaries of the film bonding area FBA. That is, in the overcoat layer 430, a portion except for the concave portion 432 makes contact with an upper boundary of the film bonding area FBA and a lower boundary of the film bonding area FBA.

The overcoat layer 430 includes the concave portion 432 which is concavely dug in the first direction, between each of the plurality of LOG lines LOG. Here, the first direction means up and down directions in the drawing, and the concave portion 432 is concavely dug in a direction far from the film bonding area FBA. A shape of the concave portion 432 may be variously designed besides a rectangle shown in the drawing.

The overcoat layer 430 prevents an exposure of the LOG line LOG compared to the normal pad structure shown in FIG. 3B, and thus can prevent a corrosion of the LOG line. In addition, the overcoat layer 430 can prevent an open of the LOG line LOG due to the step difference of the insulating films 312 and 322, compared to the normal pad structure shown in FIG. 3A.

Meanwhile, when the concave portion 432 is not included in the overcoat layer 430 and all boundaries of the overcoat layer 430 make contact with the film bonding area FBA, a remaining film of material in the metal layers 410, 420 and 440 of neighboring LOG line LOG, for example, ITO which is the same as material of the pixel electrode (not shown) is formed in the insulating films 312 and 322, and thus a short between different LOG lines LOG may occur. The concave portion 432 of the overcoat layer 430 prevents such a short.

Meanwhile, the length d1 dug in the first direction of the concave portion 432 in the overcoat layer 430 may be longer than the width d2 between adjacent LOG lines LOG. Thus, the short between the adjacent LOG lines LOG can be prevented.

In FIG. 5, five LOG lines LOG are successively arranged in parallel, but embodiments are not limited thereto, and various numbers of LOG lines may be formed. In addition, the shape and the dug length d1 of the concave portion 432 may be formed in various ways.

Figure 6:
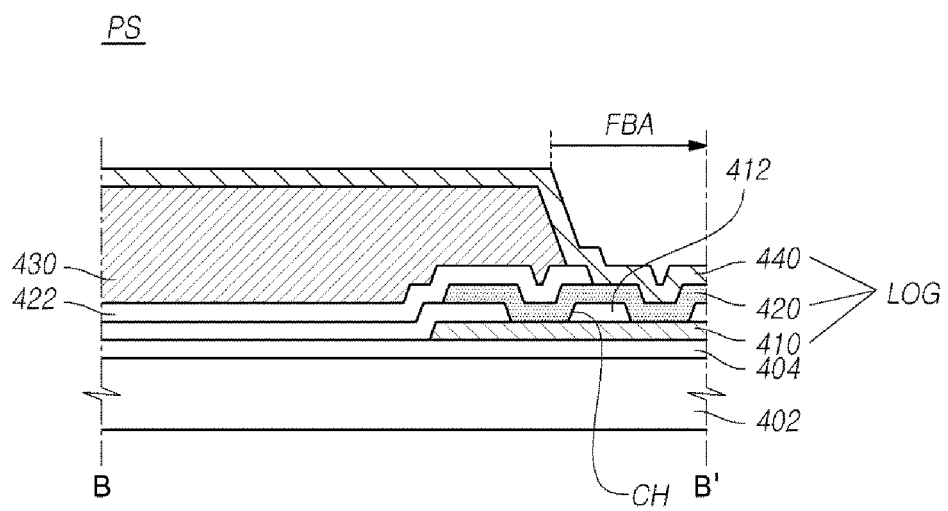
FIG. 6 is a cross-sectional view taken along a line B-B' of FIG. 5, according to one embodiment.

FIG. 6 is a cross-sectional view taken along a line B-B' of FIG. 5, according to one embodiment.

Referring to FIG. 6, the pad structure of the display device 100 includes a first insulating film 404 on a substrate 402, a first metal layer 410 on the first insulating film 404, a second insulating film 412 covering the first metal layer 410 and having at least one contact hole CH, and a second metal layer 420 disposed on the second insulating film 412 and connected to the first metal layer 410 through the contact hole CH. Here, the first metal layer 410 and the second metal layer 420 are formed in a Film Bonding Area (FBA) where the data driving film 206 or the gate driving film 208 is bonded.

In addition, the pad structure PS includes a third insulating film 422 on the second insulating film 412 and an overcoat layer 430 on the third insulating film 422, in an external area of the film bonding area FBA. In addition, the pad structure PS includes a third metal layer 440 covering the overcoat layer 430 and the second metal layer 420.

The first metal layer 410, the second metal layer 420 and the third metal layer 440 forms the LOG line.

In the case of the normal pad structure PS, compared to FIG. 3A, an open phenomenon may occur in which the third metal layer 340 is disconnected due to a step difference in the insulating films 312 and 322. That is, an occurrence of an open area (OA) in the step difference between insulating films 312 and 322 is prevented.

Figure 7:
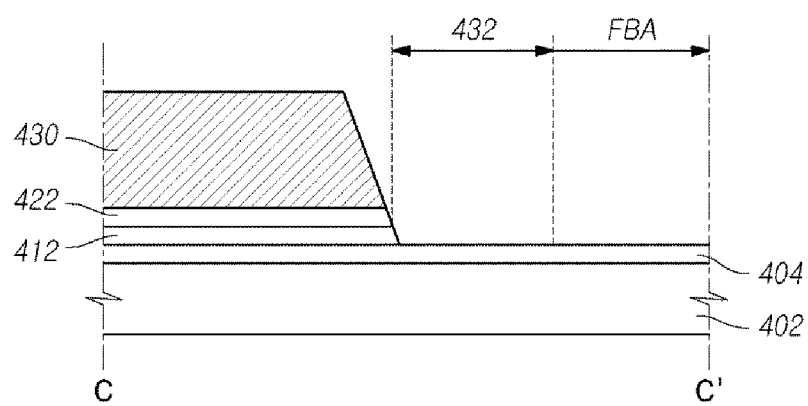
FIG. 7 is a cross-sectional view taken along a line C-C' of FIG. 5, according to one embodiment.

FIG. 7 is a cross-sectional view taken along a line C-C' of FIG. 5.

Referring to FIG. 7, the pad structure PS includes the first insulating film 404 on the substrate 402, the second insulating film 412 on the first insulating film 404, the third insulating film 422 on the second insulating film 412, and the overcoat layer 430 on the third insulating film 422.

The pad structure PS shown in FIG. 7 shows an area where the LOG line LOG is not formed. That is, the pad structure PS shown in FIG. 7 shows an area between adjacent LOG lines LOG. Here, the second insulating film 412, the third insulating film 422 and the overcoat layer 430 are positioned to the outside of the film bonding area FBA, and are formed correspondingly to an area where the concave portion 432 of the overcoat layer 430 is formed.

The concave portion 432 of the overcoat layer 430 can prevent an occurrence of a remaining film of the metal layers 410, 420 and 440, which may be formed in the overcoat layer 430.

Figure 8:
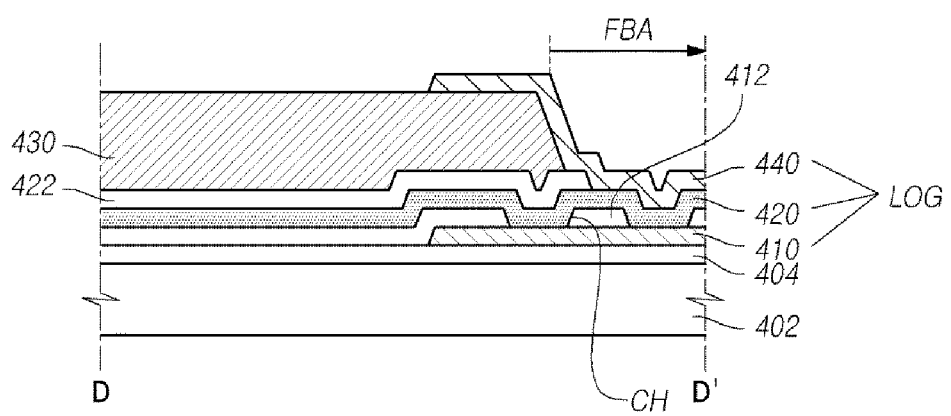
FIG. 8 is a cross-sectional view taken along a line D-D' of FIG. 5, according to one embodiment.

FIG. 8 is a cross-sectional view taken along a line D-D' of FIG. 5, according to one embodiment.

Referring to FIG. 8, the pad structure PS of the display device 100 includes the first insulating film 404 on the substrate 402, the first metal layer 410 on the first insulating film 404, the second insulating film 412 covering the first metal layer 410 and having at least one contact hole CH, and the second metal layer 420 disposed on the second insulating film 412 and connected to the first metal layer 410 through the contact hole CH.

In addition, the pad structure PS includes the third insulating film 422 on the second insulating film 412 and the overcoat layer 430 on the third insulating film 422, in the external area of the film bonding area FBA. In addition, the pad structure PS includes the third metal layer 440 positioned to the film bonding area FBA and making contact with the second metal layer 420.

Here, the first metal layer 410 and the second metal layer 420 are formed in the film bonding area FBA on which the data driving film 206 or the gate driving film 208 is bonded. In contrast, the second metal layer 420 is disposed in the film bonding area FBA, and is further extended to the outside of the film bonding area FBA. In addition, the first metal layer 410, the second metal layer 420 and the third metal layer 440 form the LOG line.

In the case of such a pad structure PS, compared to the normal pad structure PS shown in FIG. 3B, an occurrence of a corrosion area where the second metal layer 320 is exposed to the outside and is corroded can be prevented.

To sum up, the pad structure PS according to the embodiments and the associated display device can prevent corrosion of the LOG line LOG, prevent an open circuit of the LOG line LOG in the step area of the insulating films 412 and 422, and prevent a short circuit among different metal layers 410, 420 and 440, by the overcoat layer 430 including the concave portion 432.

Although various embodiments have been described up to now with reference to the accompanying drawings, the present disclosure is not limited to them.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings unless explicitly defined otherwise by the present disclosure.

Although the embodiments have been described for illustrative purposes, those skilled in the art will appreciate that various modifications, additions and substitutions are possible, without departing from the scope of the appended claims. Accordingly, the embodiments disclosed herein are intended to describe and should not be construed as limiting. Further, the scope of the present disclosure is not limited by the embodiments. The scope of the present disclosure shall be construed on the basis of the accompanying claims in such a manner that all of the technical ideas included within the scope equivalent to the claims belong to the present disclosure.

Additionally, a pad structure is provided including: a plurality of Line On Glass (LOG) lines that are arranged in parallel, in a first direction within a film bonding area, and including a plurality of metal layers of which at least one extends to an outside of the film bonding area, the film bonding area being in a non-active area of a substrate. The plurality of LOG lines are spaced apart from each other; and an overcoat layer that is positioned in an external area of the film bonding area, adjacent to both boundaries of the film bonding area, includes a concave portion between each of the plurality of LOG lines which is dug concavely in the first direction.

Optionally, the overcoat layer overlaps the metal layer which extends to the outside of the film bonding area.

Optionally, the concave portion of the overcoat layer does not overlap the metal layer which extends to the outside of the film bonding area.

Optionally, the dug length of the concave portion of the overcoat layer in the first direction is longer than the width between adjacent LOG lines.

Optionally, the LOG line includes a first metal layer, a second metal layer and a third metal layer, the first metal layer is connected to the second metal layer through at least one contact hole positioned in an insulating film between the first metal layer and the second metal layer, and the second metal layer makes contact with the third metal layer.

Optionally, the second metal layer and the third metal layer in the plurality of LOG lines alternately extend to the outside of the film bonding area.

Also provided is a display device including: a plurality of signal lines that are arranged in an active area of a substrate; and a pad structure that is positioned in a non-active area of the substrate, wherein the pad structure includes: a plurality of Line On Glass (LOG) lines that are arranged in parallel, in a first direction within a film bonding area, and include a plurality of metal layers of which at least one extends to an outside of the film bonding area, the film bonding area being in the non-active area of the substrate. The plurality of LOG lines are spaced apart from each other; and an overcoat layer that is positioned in an external area of the film bonding area, adjacent to both boundaries of the film bonding area, includes a concave portion between each of the plurality of LOG lines. The concave portion is dug concavely in the first direction.

Optionally, the overcoat layer overlaps the metal layer which extends to the outside of the film bonding area.

Optionally, the concave portion of the overcoat layer does not overlap the metal layer which extends to the outside of the film bonding area.

Optionally, the dug length of the concave portion of the overcoat layer in the first direction is longer than the width between adjacent LOG lines.

Optionally, wherein the plurality of signal lines are connected to at least one metal layer of the LOG line.

What is claimed is:

1. A pad structure comprising:
a plurality of line on glass (LOG) lines that are arranged in parallel in a first direction and in a film bonding area (FBA), wherein each of the LOG lines includes a plurality of metal layers of which at least one extends to an outside of the film bonding area (FBA), with the film bonding area (FBA) in a non-active area (NA) of a substrate, and the LOG lines spaced apart from each other,
wherein the pad structure further comprises an overcoat layer that is positioned in an external area of the film bonding area (FBA) and is adjacent to a first boundary and a second boundary of the film bonding area, wherein the overcoat layer includes a removed portion between each of the LOG lines, and wherein the removed portion extends in the first direction from an edge of the overcoat layer, and
wherein the LOG lines are arranged in parallel in groups between high voltage power lines and the length of the removed portion of the overcoat layer in the first direction is longer than the width of the removed portion between adjacent LOG lines of the same group.

2. The pad structure of claim 1, wherein the overcoat layer overlaps the at least one metal layer of the plurality of metal layers which extends to the outside of the film bonding area (FBA).

3. The pad structure of claim 1, wherein the removed portion of the overcoat layer does not overlap the at least one metal layer of the plurality of metal layers which extends to the outside of the film bonding area (FBA).

4. The pad structure of claim 1, wherein the length of the removed portion of the overcoat layer in the first direction is longer than the width of the removed portion between adjacent LOG lines.

5. The pad structure of claim 1, wherein each LOG line includes a first metal layer, a second metal layer and a third metal layer, and wherein the first metal layer is connected to the second metal layer through at least one contact hole (CH) positioned in an insulating film between the first metal layer and the second metal layer, and wherein the second metal layer makes contact with the third metal layer.

6. The pad structure of claim 5, wherein in alternate LOG lines the second metal layer extends to the outside of the film bonding area (FBA) and in remaining LOG lines the third metal layer extends to the outside of the film bonding area (FBA).

7. The pad structure of claim 6, wherein the second and third metal layers extend to the outside of the film bonding area (FBA) through the first boundary of the film bonding area.

8. The pad structure of claim 5, wherein in each LOG line the first metal layer extends to the outside of the film bonding area (FBA).

9. The pad structure of claim 5, wherein in each LOG line the first metal layer passes through the second boundary of the film bonding area (FBA).

10. The pad structure of claim 5, wherein the overcoat layer overlaps the portion of the second metal layer which extends to the outside of the film bonding area (FBA).

11. The pad structure of claim 5, wherein the portion of the third metal layer which extends to the outside of the film bonding area (FBA) overlaps the overcoat layer.

12. A display device comprising:
a plurality of signal lines that are arranged in an active area of a substrate; and
a pad structure which comprises a plurality of line on glass (LOG) lines that are arranged in parallel in a first direction and in a film bonding area (FBA), wherein each of the LOG lines includes a plurality of metal layers of which at least one extends to an outside of the film bonding area (FBA), with the film bonding area (FBA) in a non-active area (NA) of a substrate, and the LOG lines spaced apart from each other, and wherein the pad structure further comprises an overcoat layer that is positioned in an external area of the film bonding area (FBA) and is adjacent to a first boundary and a second boundary of the film bonding area, wherein the overcoat layer includes a removed portion between each of the LOG lines, and wherein the removed portion extends in the first direction from an edge of the overcoat layer;
and wherein the pad structure is positioned in a non-active area (NA) of the substrate, and
wherein the LOG lines are arranged in parallel in groups between high voltage power lines and the length of the removed portion of the overcoat layer in the first direction is longer than the width of the removed portion between adjacent LOG lines of the same group.

13. The display device of claim 12, wherein each signal line of the plurality of signal lines is connected to at least one metal layer of a corresponding LOG line.

\* \* \* \* \*